(12) United States Patent
Chuang

(10) Patent No.: US 6,894,433 B2
(45) Date of Patent: May 17, 2005

(54) ORGANIC ELECTRO-LUMINESCENT DEVICE

(75) Inventor: Feng-Ju Chuang, Hsinchu (TW)

(73) Assignee: Opto Tech Corporation, Hsinchu (TW)

( * ) Notice: Subject to any disclaimer, the term of this patent is extended or adjusted under 35 U.S.C. 154(b) by 224 days.

(21) Appl. No.: 10/291,410

(22) Filed: Nov. 12, 2002

(65) Prior Publication Data

US 2004/0090178 A1 May 13, 2004

(51) Int. Cl.$^7$ ................................................ H01J 1/62
(52) U.S. Cl. ...................................... 313/506; 313/509
(58) Field of Search ................................ 313/498, 504, 313/506, 509, 512

(56) References Cited

U.S. PATENT DOCUMENTS 5,804,917 A * 9/1998 Takahashi et al. .......... 313/504

* cited by examiner

*Primary Examiner*—Vip Patel
(74) *Attorney, Agent, or Firm*—Rosenberg, Klein & Lee

(57) ABSTRACT

An organic electro-luminescent (EL) device is provided. The present invention discloses that the number of moisture-absorbing channels is increased to prevent the generation of dark spots and to improve the luminescence quality of the organic EL device. The organic electro-luminescent (EL) device comprises: a substrate; at least a bottom electrode, formed on the substrate, a plurality of isolation ribs for moisture-absorption and insulation, formed on a surface of the bottom electrode, intersecting the bottom electrode, wherein regions between every two of the isolation ribs are pre-determined light-emitting regions; at least an organic layer comprising an organic electro-luminescent layer, formed on a surface of the bottom electrode in the pre-determined light-emitting region; and at least an opposed electrode, formed on a surface of the organic layer. The isolation ribs are formed of PSG for removing the moisture generated during the processing of the organic EL device so as to prevent the generation of dark spots. Furthermore, the isolation ribs are helpful to achieve fine patterns of the device and avoid display crosstalk.

16 Claims, 3 Drawing Sheets

ORGANIC ELECTRO-LUMINESCENT DEVICE

BACKGROUND OF THE INVENTION

1. Field of the Invention

The present invention generally relates to an organic electro-luminescent (to be abbreviated as "EL" hereinafter) device, and more particularly to an organic EL device provides increasing the number of moisture-absorbing channels to prevent the generation of dark spots and to improve the luminescence quality of the organic EL device.

2. Description of the Prior Art

The organic EL device has attracted tremendous attention due to its advantages over other display panels. These advantages include larger visual angle, shorter response time, smaller dimension in thickness, lower power consumption, simpler fabrication, no need for backlighting, and the ability for light emitting in a full color range.

Please refer to FIG. 1, which is a cross-sectional view showing the structure of a conventional organic EL device in accordance with the prior art. The organic EL device is characterized in that a bottom electrode 12 is formed on a substrate 11, and on the bottom electrode 12 there are an organic layer 13 comprising a hole injection layer, a hole transport layer, an organic emitting layer or an electron transport layer, an opposed electrode 14 and an sealing cap layer 15 formed by evaporation in turn. Since, in an organic EL device, the light is generated when the electrons and holes from the bottom electrode 12 and opposed electrode 14 combine in the organic layer 13 to excite the organic emitting layer, it is inevitable that heat is generated during the luminescence process. Once the heat encounters the moisture existing inside the sealing cap layer 15, dark spots due to oxidation will be formed on the surface of the organic layer 13. The existence of such dark spots adversely affects the luminescence quality such as luminescence intensity and luminescence uniformity of an organic EL device. More seriously, the lifetime of an organic EL device may be substantially shortened.

In order to overcome the image defects due to the undesirable dark spots, the industry has developed a number of prior art organic EL displays to improve the image quality. For example, in Japanese Patent Nos. JP-A-363890 and JP-A-5-114486, it is disclosed that liquid fluorinated carbon is disposed inside the sealing cap layer 15 to effectively remove the heat generated during the luminescence process. In Japanese Patent No. JP-A-5-41281, it is disclosed that dehydrating agents such as a synthetic zeolite are mixed in the liquid fluorinated carbon to effectively remove the moisture existing in the periphery of the device. Moreover, in U.S. Pat. No. 5,962,962, entitled "Method of encasesulating organic electro-luminescence device and organic electro-luminescence device", it is disclosed that a silicone oil or a silicone grease is used as a protective liquid to remove the existing moisture.

The above prior arts can reduce the generation of dark spots to some extent; however, the dehydrating agents such as liquid fluorinated carbon may add difficulty to the fabrication process, which is unfavorable for fabrication integration and reduction in cost.

Accordingly, a second prior art structure of an organic EL device is proposed as shown in FIG. 2. In U.S. Pat. No. 5,882,761, entitled "Organic EL element", it is disclosed that a drying film 17 is attached to the inner surface of a sealing cap layer 15 and an internal space 19 is formed between the drying film 17 and an opposed electrode 14. The solid-state drying film 17 absorbs the moisture existing inside the sealing cap layer 15, so as to prevent the generation of dark spots.

Even though the U.S. Pat. No. 5,882,761 can overcome some of the problems in the prior arts, it still has the following drawbacks:

1. The fine pattern of the organic EL device is not precise enough, thus a minute short circuit may occur between the two electrodes, leading to undesirable display cross-talk.
2. The sealing cap layer is not resistant to any possible external force because it covers the substrate without a supporting member, making the organic EL device easily damaged.
3. In spite of the full-color luminescence capability, the organic EL device is limited in its applications.

Therefore, there is need in providing an improved organic EL device with simplified manufacturing processing, high precision, high durability, excellent resistance to external force, negligibly low dark spot generation and excellent luminescence quality.

SUMMARY OF THE INVENTION

Therefore, it is the primary object of the present invention to provide an organic EL device, characterized in that a drying flange is disposed on the top surface of each of a plurality of isolation ribs so as to achieve fine patterns, enhance moisture-absorbing, and prevent the generation of dark spots.

It is another object of the present invention to provide an organic EL device, characterized in that the isolation ribs are disposed to support a sealing cap layer or a sealing layer such that the organic EL device is resistant to external forces.

It is still another object of the present invention to provide an organic EL device, characterized in that corresponding light-emitting layers are disposed in different light-emitting regions defined by the isolation ribs so as to achieve full-color luminescence.

It is still another object of the present invention to provide an organic EL device that is manufactured by using the existing IC technology such that the organic EL device can be integrated with ICs.

It is still another object of the present invention to provide an organic EL device, characterized in that the isolation ribs are formed of heat dissipating materials so as to dissipate the heat generated during the luminescence process and further prevent the generation of dark spots.

In order to achieve the foregoing objects, the present invention provides an organic EL device, comprising: a substrate; at least a bottom electrode, formed on said substrate; a plurality of isolation ribs for moisture-absorption and insulation, formed on a surface of said bottom electrode, intersecting said bottom electrode, wherein regions between every two of said isolation ribs are pre-determined light-emitting regions; at least an organic layer comprising an organic electro-luminescent layer, formed on a surface of said bottom electrode in said pre-determined light-emitting region; and at least an opposed electrode, formed on a surface of said organic layer.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing an organic electroluminescent (EL) device can be exemplified by the preferred embodiment as described hereinafter.

Figure 3:
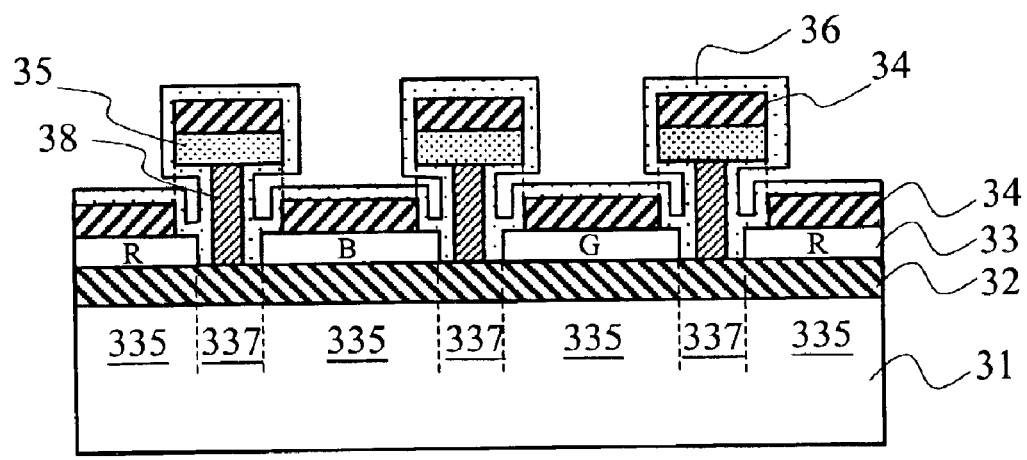
FIG. 3 is a cross-sectional view showing the structure of an organic EL device in accordance with the preferred embodiment of the present invention.

To start with, please refer to FIG. 3, which is a cross-sectional view showing the structure of an organic EL device in accordance with the preferred embodiment of the present invention. As shown in FIG. 3, the organic EL device comprises: a substrate 31; a bottom electrode 32 formed of a transparent material (such as ITO, IZO, or other transparent thin metal films) on the surface of the substrate 31; a plurality of isolation ribs 38 formed on the bottom electrode 32, intersecting the bottom electrode 32, by using conventional IC processing steps such as spin coating, dipping, evaporation, sputtering, etching, etc.; and a plurality of drying flanges 35 on the isolation ribs 38, wherein the projection area of a drying flange 35 is larger than that of an isolation rib 38 and the regions under the drying flanges 35 are non-light-emitting regions 337. The regions between every two non-light-emitting regions 337 are pre-determined light-emitting regions 335. Furthermore, the organic EL device comprises: an organic layer 33, comprising at least an organic emitting layer formed by evaporation or sputtering on the surface of the bottom electrode 32 in the pre-determined light-emitting regions 335; an opposed electrode 34, formed by evaporation or sputtering on the organic layer 33; and a sealing layer 36, covering the whole device.

The organic layer 33 comprises one of an organic layer (B) for emitting a blue light, an organic layer (G) for emitting a green light, an organic layer (R) for emitting a red light and combination thereof. The isolation rib 38 is formed of an insulating material selected from silicon oxide, silicon nitride, silicon oxynitride, TEOS-oxide, USG, ON, ONO, PSG, BPSG and BSG so as to isolate the bottom electrode 32 and the opposed electrode 34 and prevent a minute short circuit between the electrodes 32 and 34 and undesirable display cross-talk. The isolation rib 38 also functions as a supporting member for the sealing layer 36 so as to achieve external force protection and fine patterns.

Moreover, in order to absorb the moisture existing in the sealing layer 36, the drying flange 35 is formed of a material selected from PSG, BPSG, BSG and an alkaline-earth metal oxide compounds such as of MgO, CaO, SrO and BaO. The aforementioned moisture-absorbing materials function as a drying film that can chemically absorb the moisture and never release the moisture back. Therefore, the organic layer inside the sealing layer is kept dehumidified. It is very helpful to prevent the generation of dark spots, improve the reliability and prolong the lifetime of the device. Furthermore, the insulating materials employed as the isolation rib 38 and the drying flange 35 also help to reduce the display cross-talk.

Figure 1:
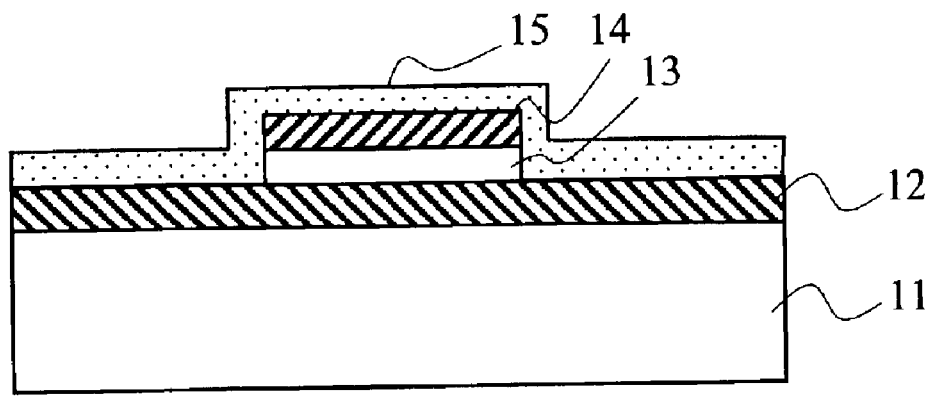
FIG. 1 is a cross-sectional view showing the structure of a conventional organic EL device in accordance with the prior art.
Figure 2:
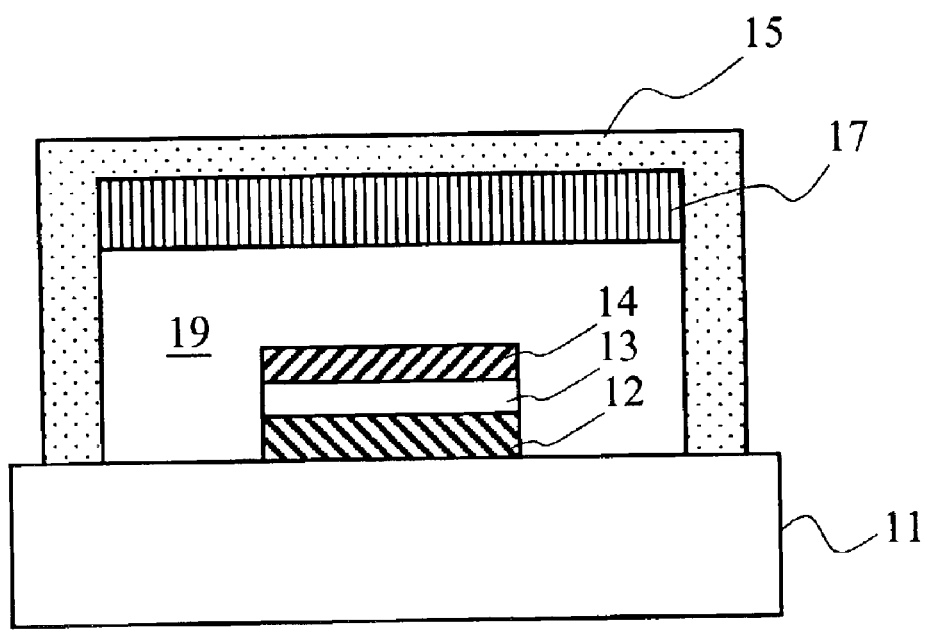
FIG. 2 is a cross-sectional view showing the structure of another conventional organic EL device in accordance with the prior art.

Certainly, it is one of the primary objects of the drying flange 35 to enhance the precision of the fine patterns of the organic EL device by effectively isolating the organic layer 33 and the opposed electrode 34. Therefore, the internal space 19 (FIG. 2) as disclosed in U.S. Pat. No. 5,882,761 can be replaced by the preferred embodiment of the present invention. Alternatively, the drying flange 35 can be formed of drying materials such as alkaline metal oxide compounds, alkaline-earth metal oxide compounds, sulphates, metal halides and perchlorates. The drying flange 35 is isolated from the organic layer 33 by the isolation rib 38 and thus the drying materials do not influence the organic layer 33.

Alternatively, the drying flange 35 and the isolation rib 38 are formed of polymer for absorbing the moisture so as to keep everything inside the sealing layer 36 dehumidified. When using polymer only, the substrate has to be baked in a furnace at a temperature range of 100° C.~300° C. so as to remove the moisture before the organic layer 33 is formed by evaporation.

Figure 4:
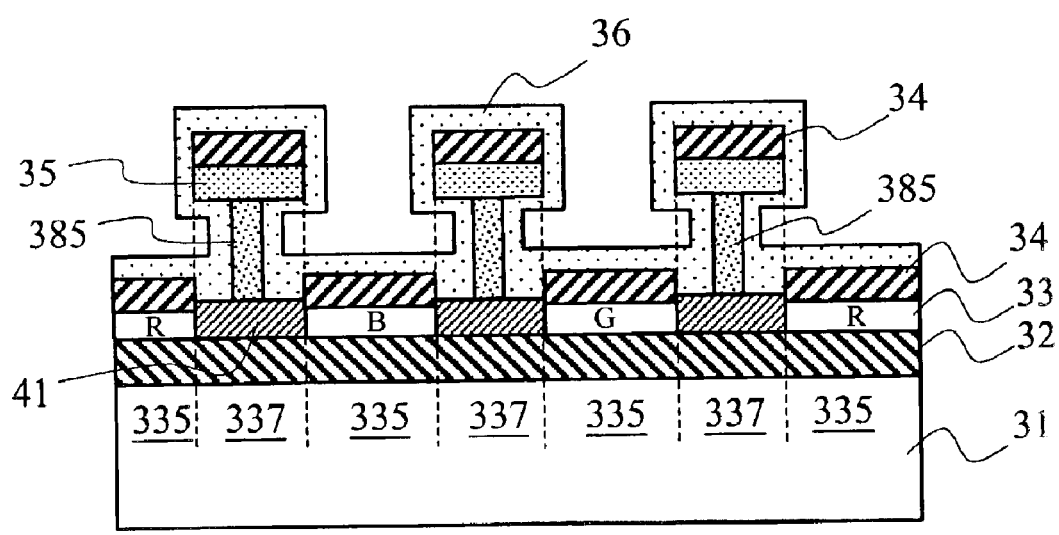
FIG. 4 is a cross-sectional view showing the structure of an organic EL device in accordance with another embodiment of the present invention.

Furthermore, please refer to FIG. 4, which is a cross-sectional view showing the structure of an organic EL device in accordance with another embodiment of the present invention. As shown in FIG. 4, the organic EL device is characterized in that an insulating layer 41 is interposed between the bottom of the isolation rib 385 and the bottom electrode 32. The insulating layer 41 is tightly attached to the organic layer 33 so as to completely prevent the short circuit that may occur between the bottom electrode 32 and the opposed electrode 34. In this case, the isolation rib 385 and the drying flange 35 are formed of the same material, for example, PSG, BPSG, BSG, alkaline-earth metal oxide compounds such as MgO, CaO, SrO, BaO, alkaline metal oxide compounds, sulphates, metal halides, perchlorates and polymer so as to keep everything inside the sealing layer 36 dehumidified.

Certainly, the isolation rib 385 and the drying flange 35 can be replaced with a cone-shaped isolation rib formed by etching.

Figure 5:
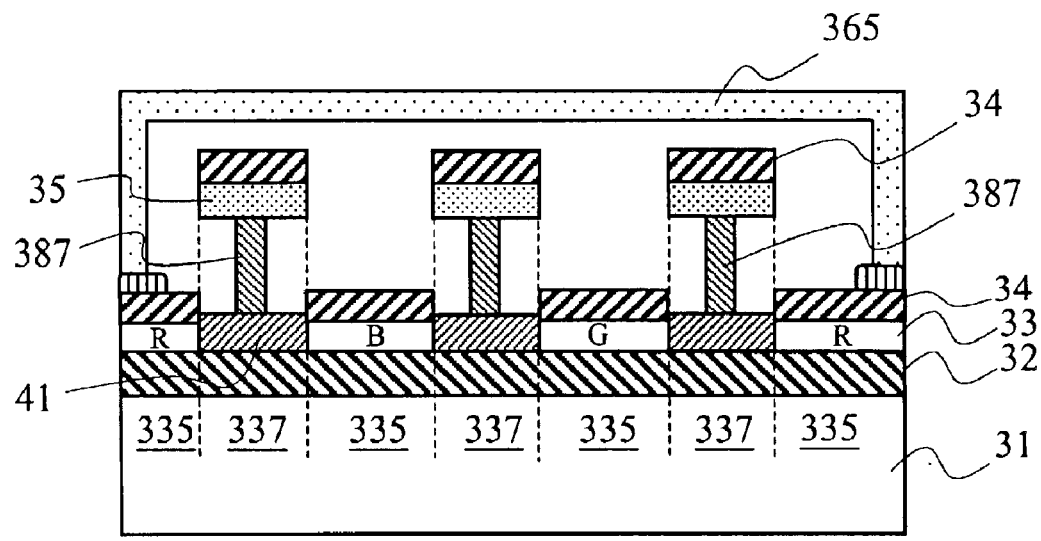
FIG. 5 is a cross-sectional view showing the structure of an organic EL device in accordance with still another embodiment of the present invention.

Furthermore, please refer to FIG. 5, which is a cross-sectional view showing the structure of an organic EL device in accordance with still another embodiment of the present invention. As shown in FIG. 5, the organic EL device is characterized in that the isolation rib (385 in FIG. 4) of the previous embodiment is replaced with a heat-dissipating rib 387. The heat-dissipating rib 387 is formed of a material selected from metal elements such as Cu, Au, Ag, W and Mo, metal compounds such as aluminum nitride, aluminum oxide, magnesium oxide, beryllium oxide and $TiB_2$, and heat-dissipating non-metal compounds such as boron nitride, epoxy resin and silicon carbide. In this case, the heat-dissipating rib 387 removes the heat generated in the organic layer 33 during the luminescence process. The drying flange 35 on the top of the heat-dissipating rib 387 absorbs the moisture inside the sealing cap layer 365 so as to protect the organic layer 33 and the opposed electrode 34 from being oxidized and from the generation of dark spots.

Figure 6:
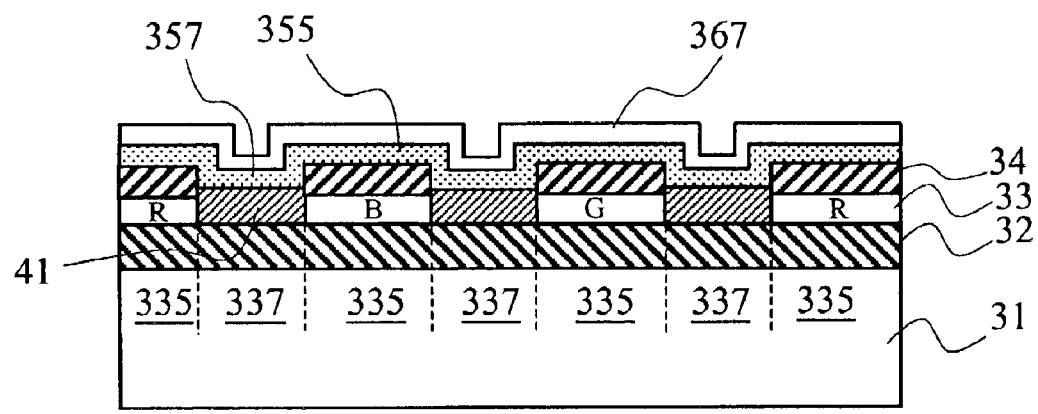
FIG. 6 is a cross-sectional view showing the structure of an organic EL device in accordance with yet another embodiment of the present invention.

At last, please refer to FIG. 6, which is a cross-sectional view showing the structure of an organic EL device in accordance with yet another embodiment of the present invention. As shown in FIG. 6, the organic EL device is characterized in that a drying substrate 357 formed of a drying material is formed on the opposed electrode 34 and the insulating layer 41. The organic layer 33 is protected by the opposed electrode 34 and the insulating layer 41, and therefore the organic layer 33 is not influenced by the drying substrate 357. Therefore, in the present embodiment, the heat-dissipating rib (387 in FIG. 5) is not necessary for absorbing the moisture in the sealing layer 367. For more convenience in fabrication, the drying material can be deposited directly on the opposed electrode 34 and the insulating layer 41 so as to complete a larger drying substrate 367.

According to the above discussion, the present invention discloses an organic EL device characterized in that the number of moisture-absorbing channels is increased so as to prevent the generation of dark spots and to improve the luminescence quality of the organic EL device. Therefore, the present invention has been examined to be novel, non-obvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An organic electro-luminescent EL device comprising:
   a substrate;
   at least a bottom electrode, formed on said substrate,
   a plurality of isolation ribs for moisture-absorbing and insulating, formed on a surface of said bottom electrode, intersecting said bottom electrode, wherein regions between every two of said isolation ribs are pre-determined light-emtttng regions;
   at least an organic layer comprising an organic electro-luminescent layer, formed on a surface of said bottom electrode in said pre-determined light-emitting region; and,
   at least an opposed electrode, formed on a surface of said organic layer
   wherein said isolation ribs are formed of a material selected from BPSG, PSG, MgO, CaO, SrO, BaO and polymer.

2. The organic electro-luminescent EL device as recited in claim 1, further comprising an insulating layer interposed between said isolation ribs and said bottom electrode, wherein a projection area of said insulating layer is larger than that of one of said isolation ribs.

3. The organic EL device as recited in claim 2, wherein said insulating layer is formed of a material selected from silicon oxide, silicon nitride, silicon oxynitride, TEOS-oxide, USG, ON, ONO, BPSG, PSG and BSG.

4. The organic electro-luminescent EL device as recited in claim 1, further comprising a drying flange for moisture-absorbing, formed on the top of each of said isolation ribs, wherein a projection area of said drying flange is larger than that of one of said isolation ribs.

5. The organic EL device as recited in claim 4, wherein said drying flange and said isolation ribs are formed of the same material.

6. The organic EL device as recited in claim 4, wherein said drying flange is formed of a material selected from alkaline metal oxide compounds, alkaline-earth metal oxide compounds, sulphates, metal halides, perchlorates and polymer.

7. An organic EL device, comprising:
   a substrate;
   at least a bottom electrode, formed on said substrate,
   a plurality of isolation ribs, formed on a surface of said bottom electrode, intersecting said bottom electrode, wherein regions between every two of said isolation ribs are pre-determined light-emitting regions;
   at least a dry flange for moisture-absorption, disposed on a top surface of a corresponding one of said isolation ribs;
   at least an organic layer comprising an organic electro-luminescent layer, formed on a surface of said bottom electrode in said pre-determined light-emitting region; and
   at least an opposed electrode, formed on a surface of said organic layer.

8. An organic EL device, comprising:
   a substrate;
   at least a bottom electrode, formed on said substrate,
   a plurality of isolation ribs for moisture-absorbing, each formed on a surface of said bottom electrode, intersecting said bottom electrode, wherein regions between every two of said isolation ribs are pre-determined light-emitting regions;
   a plurality of insulating layers, each interposed between one of said isolation ribs and said bottom electrode, wherein a projection area of one of said insulating layers is larger than that of one of said isolation ribs;
   at least an organic layer comprising an organic electro-luminescent layer, formed on a surface of said bottom electrode in said pre-determined light-emitting region; and
   at least an opposed electrode, formed on a surface of said organic layer.

9. The organic EL device as recited in claim 8, further comprising at least a drying flange for moisture-absorbing, formed on the top of each of said isolation ribs.

10. The organic EL device as recited in claim 9, wherein each of said isolation ribs is a heat-dissipating rib for heat-dissipating.

11. The organic EL device as recited in claim 10, wherein said heat-dissipating rib is formed of a material selected from Cu, Au, Ag, W, Mo, aluminum nitride, aluminum oxide, magnesium oxide, beryllium oxide, $TiB_2$, and other heat-dissipating metal compounds.

12. The organic EL device as recited in claim 10, wherein said heat-dissipating rib is formed of a material selected from boron nitride, epoxy resin, silicon carbide and other heat-dissipating non-metal compounds.

13. The organic EL device as recited in claim 8, wherein each of said isolation ribs is formed of a material selected from BPSG, PSG, BSG, alkaline metal oxide compounds, alkaline-earth metal oxide compounds, sulphates, metal halides, perchlorates and polymer.

14. An organic EL device, comprising:
   a substrate;
   at least a bottom electrode, formed on said substrate, a plurality of insulating layers each formed on a surface of said bottom electrode, intersecting said bottom electrode, wherein drying substrates for moisture-absorpting are disposed on a surface of said insulating layers and a pre-determined light-emitting region is formed interposed between two of said insulating layers;

at least an organic layer comprising an organic electroluminescent layer, formed on a surface of said bottom electrode in said pre-determined light-emitting region; and at least an opposed electrode, formed on a surface of said organic layer.

15. The organic EL device as recited in claim 14, wherein the vertical height of said insulating layer is higher than that of said organic layer.

16. The organic EL device as recited in claim 14, wherein said drying substrates are disposed on the top surface of said opposed electrode.

* * * * *